US012610863B2

(12) United States Patent
Templier et al.

(10) Patent No.: US 12,610,863 B2
(45) Date of Patent: Apr. 21, 2026

(54) INTERACTIVE DISPLAY DEVICE AND METHOD OF MANUFACTURING SUCH A DEVICE

(71) Applicant: Commissariat à l'Énergie Atomique et aux Énergies Alternatives, Paris (FR)

(72) Inventors: François Templier, Grenoble (FR); Fabrice Casset, Grenoble (FR); Mikael Colin, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 646 days.

(21) Appl. No.: 17/985,071

(22) Filed: Nov. 10, 2022

(65) Prior Publication Data

US 2023/0154907 A1 May 18, 2023

(30) Foreign Application Priority Data

Nov. 16, 2021 (FR) ...................................... 2112104

(51) Int. Cl.
| | |
|---|---|
| *H01L 25/16* | (2023.01) |
| *B06B 1/02* | (2006.01) |
| *B06B 1/06* | (2006.01) |
| *G06F 3/01* | (2006.01) |
| *H01L 25/075* | (2006.01) |
| *H10N 30/03* | (2023.01) |

(52) U.S. Cl.
CPC .......... *H01L 25/167* (2013.01); *B06B 1/0292* (2013.01); *B06B 1/0622* (2013.01); *G06F 3/016* (2013.01); *H01L 25/0753* (2013.01); *H10N 30/03* (2023.02)

(58) Field of Classification Search
CPC ........... H10N 39/00; H10H 20/00–882; H10H 29/00–142; H10H 29/30–962
See application file for complete search history.

(56) References Cited

U.S. PATENT DOCUMENTS

| | | | |
|---|---|---|---|
| 2015/0177078 A1* | 6/2015 | Dumitru | ................... G01L 1/26 |
| | | | 73/777 |
| 2017/0110504 A1 | 4/2017 | Panchawagh et al. | |
| 2019/0065806 A1 | 2/2019 | Cheng et al. | |
| 2019/0187748 A1* | 6/2019 | Lim | ................... H10H 20/8312 |
| 2019/0197284 A1* | 6/2019 | Park | ....................... H10K 59/40 |
| 2020/0395510 A1 | 12/2020 | Bower et al. | |

OTHER PUBLICATIONS

Preliminary Search Report for French Application No. 2112104, dated Jun. 24, 2022.

* cited by examiner

*Primary Examiner* — Christine S. Kim
*Assistant Examiner* — Cole Leon Lindsey
(74) *Attorney, Agent, or Firm* — Wolf, Greenfield & Sacks, P.C.

(57) ABSTRACT

An optoelectronic device including at least one electromechanical transducer located vertically in line with at least one light-emitting diode, said at least one electromechanical transducer and said at least one light-emitting diode being connected to conductive tracks of a same transfer substrate.

16 Claims, 5 Drawing Sheets

(a)

(b)

INTERACTIVE DISPLAY DEVICE AND METHOD OF MANUFACTURING SUCH A DEVICE

TECHNICAL BACKGROUND

The present disclosure generally concerns the field of image display devices, and more particularly aims at an interactive image display device combining a light emission function and an electromechanical transduction function, for example, a haptic feedback function. The present disclosure further aims at a method of manufacturing such a device.

PRIOR ART

Various applications are likely to benefit from an interactive image display device combining a light emission function and an electromechanical transduction function. Such a device may for example be used to form interactive display screens of large dimensions, for example screens for a computer, television, tablet, etc.

SUMMARY OF THE INVENTION

An object of an embodiment is to overcome all or part of the disadvantages of known solutions for forming an interactive image display device combining a light emission function and an electromechanical transduction function.

For this purpose, an embodiment provides an optoelectronic device comprising at least one electromechanical transducer located vertically in line with at least one light-emitting diode, said at least one electromechanical transducer and said at least one light-emitting diode being connected to conductive tracks of a same transfer substrate.

According to an embodiment, said at least one electromechanical transducer and said at least one light-emitting diode are located on the side of a same surface of the transfer substrate.

According to an embodiment, said at least one electromechanical transducer is located on the side of a first surface of the transfer substrate and said at least one light-emitting diode is located on the side of a second surface of the transfer substrate, opposite to the first surface.

According to an embodiment, the device comprises a plurality of electromechanical transducers forming a first array and a plurality of light-emitting diodes forming a second array, the first array having a greater pitch than the second array.

According to an embodiment, the device comprises a planarization layer extending laterally between the light-emitting diodes, and a transparent protection cover covering the light-emitting diodes and the planarization layer.

According to an embodiment, the device further comprises pillars crossing the planarization layer and mechanically coupling the transducers to the transparent protection cover.

According to an embodiment, said at least one electromechanical transducer has greater lateral dimensions than said at least one light-emitting diode.

According to an embodiment, the conductive tracks form an interconnection network configured to control said at least one electromechanical transducer and said at least one light-emitting diode.

According to an embodiment, the device further comprises, for each electromechanical transducer, a selection transistor connected to said electromechanical transducer.

According to an embodiment, the selection transistor comprise a first conduction terminal connected to an electrode of said electromechanical transducer, a second conduction terminal connected to one of the conductive tracks of the transfer substrate, and a control terminal connected to another track among the conductive tracks of the transfer substrate.

According to an embodiment, said at least one electromechanical transducer comprises an active layer based on lead zirconate titanate or on aluminum nitride.

According to an embodiment, each light-emitting diode comprises a single elementary diode adapted to emitting light in a wavelength range.

According to an embodiment, each light-emitting diode comprises an elementary chip comprising a plurality of elementary diodes respectively adapted to emitting light in different wavelength ranges and an elementary circuit for controlling the elementary diodes.

According to an embodiment, said at least one electromechanical transducer is a piezoelectric transducer.

According to an embodiment, said at least one electromechanical transducer is a PMUT or CMUT transducer.

An embodiment provides a method of manufacturing an optoelectronic device, comprising the following successive steps:

a) forming at least one electromechanical transducer on a transfer substrate; and b) transferring at least one light-emitting diode onto the transfer substrate, vertically in line with said at least one electromechanical transducer, said at least one electromechanical transducer and said at least one light-emitting diode being connected to conductive tracks of the transfer substrate.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figures 1A, 1B, 1C, 1D, 1E, 2:
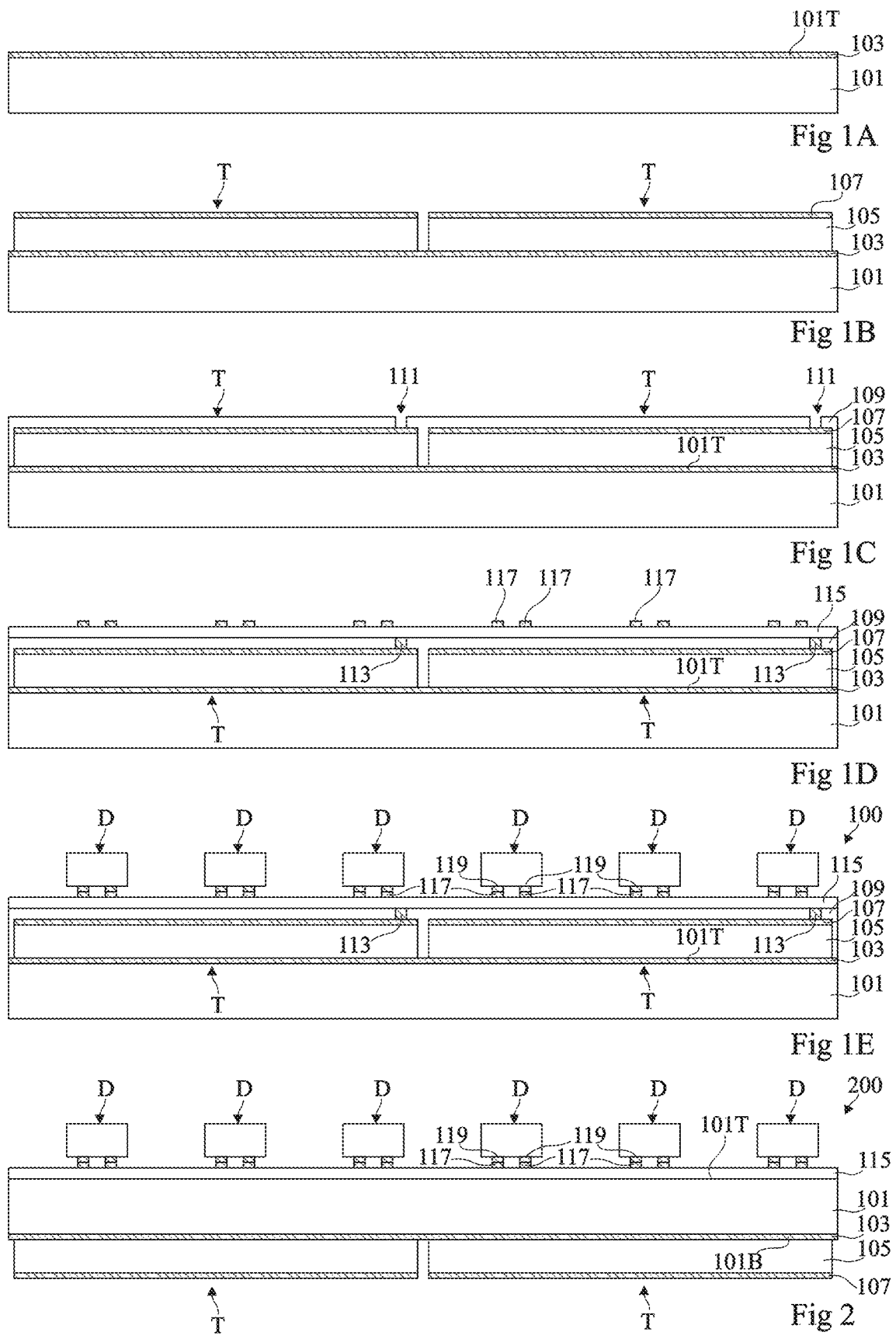
FIGS. 1A, 1B, 1C, 1D, and 1E are cross-section views illustrating successive steps of an example of a method of manufacturing an optoelectronic device according to an embodiment.
FIG. 2 is a cross-section view illustrating a variant of the optoelectronic device of FIG. 1E.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the electromechanical transducers, of the light-emitting diodes (LED), and of the integrated control circuits of the described devices has not been detailed, the detailed implementation of these elements being within the abilities of those skilled in the art based on the functional indications of the present description. Further, the various applications of the described embodiments have not been detailed, the described embodiments being compatible with all or most of the applications likely to benefit from a device combining a light emission function and an electromechanical transduction function.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

The term "transmittance of a layer" designates the ratio of the intensity of the radiation coming out of the layer to the intensity of the radiation entering the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

According to an aspect of an embodiment, an optoelectronic device combining a light emission function and an electromechanical transduction function, for example, a haptic feedback function, is formed by the implementation of a method comprising the steps of forming of at least one electromechanical transducer on a surface of a transfer substrate, then of transferring at least one light-emitting diode (LED) onto the transfer substrate, vertically in line with the electromechanical transducer.

FIGS. 1A to 1E are cross-section views illustrating successive steps of a non-limiting example of implementation of such a method. FIGS. 1A to 1E more precisely illustrate successive steps of manufacturing of an optoelectronic device 100 comprising electromechanical transducers T, for example, electroacoustic transducers, for example, ultrasound transducers, and light-emitting diodes D located on the side of a same surface 101T of a transfer substrate 101. Different variants are within the abilities of those skilled in the art based on the indications of the present description.

For simplification, FIGS. 1A to 1E illustrate the forming of an example of an optoelectronic device comprising two electromechanical transducers and six light-emitting diodes. This example is however not limiting, and the described method may of course be adapted to form optoelectronic devices comprising numbers of electromechanical transducers and of light-emitting diodes different from those shown, for example, several thousands of electromechanical transducers and of light-emitting diodes.

FIG. 1A is a cross-section view illustrating a structure obtained at the end of a step of forming, on surface 101T of transfer substrate 101 (the upper surface of transfer substrate 101, in the orientation of FIG. 1A), of an electrically-conductive layer 103.

Transfer substrate 101 may have a monoblock structure or may correspond to a layer covering a support made of another material. Transfer substrate 101 is for example made of a transparent material, for example, of glass or of a transparent polymer. Generally, substrate 101 may be made of any type of material capable of receiving electromechanical transducers T.

Electrically-conductive layer 103 coats the upper surface 101T of substrate 101 and is intended to form one or a plurality of electrodes of electromechanical transducers T. More precisely, in the shown example, layer 103 continuously extends on top of and in contact with the upper surface 101T of substrate 101 and is intended to form an electrode (the lower electrode, in the orientation of FIG. 1A) common to the electromechanical transducers T of device 100. As a variant, layer 103 may for example be etched, for example by photolithography and etching, or be deposited by a silk-screening method to form separate portions of layer 103, each defining a lower electrode of the one or a plurality of electromechanical transducers T. Connection tracks, not shown, may further be formed in layer 103. Electrically-conductive layer 103 is for example made of a metal, for example, gold, silver, platinum, molybdenum, ruthenium, titanium, etc. or of a metal alloy. As an example, layer 103 has a thickness in the order of 300 nm.

FIG. 1B is a cross-section view illustrating a structure obtained at the end of a subsequent step of forming, on the side of the upper surface 101T of substrate 101, of electromechanical transducers T.

In the shown example, each electromechanical transducer T is of piezoelectric type and comprises an active piezoelectric layer 105 interposed between lower electrode 103 and another electrode 107 (the upper electrode, in the orientation of FIG. 1B). Piezoelectric layer 105 is for example made of lead zirconate titanate (PZT) or of aluminum nitride (AlN). Upper electrode 107 is for example made of a metal, for example selected from the list of metals previously indicated for layer 103, or of a metal alloy. Upper electrode 107 is for example made of the same material as lower electrode 103. As an example, upper electrode 107 has a thickness in the range from 100 to 500 nm, for example in the order of 200 nm. As a variant, electrodes 103 and 107 are each made of a transparent conductive material, for example, a transparent conductive oxide (TCO), for example, indium-tin oxide (ITO). This enables to form a transparent device.

As an example, a discontinuous layer of conductive glue, for example of silver paste type, is formed by silk screening on layer 103, the material of the glue layer being for example only deposited at locations where electromechanical transducers T are desired to be formed. As stack comprising piezoelectric layer 105 and upper electrode 107 is for example then transferred, for each piezoelectric transducer T, onto the side of the upper surface 101T of substrate 101. A device of pick-and-place type may for example be used to position each stack comprising layer 105 and electrode 107 on conductive layer 103. It may as a variant be provided for piezoelectric layer 105 only to be first transferred onto layer 103, upper electrodes 107 being formed subsequently, for example, by sputtering of a metal layer through a stencil.

As a variant, the material of the piezoelectric layer 105 of each electromechanical transducer T may be deposited in the form of a thin layer integrally coating the upper surface of layer 103, for example by a method of sol-gel type (for example in the case of PZT) or a sputtering method (for example in the case of AlN). Separate portions of the thin layer of piezoelectric material may then be formed by photolithography and then etching, to individualize the layer 105 of each transducer T. Upper electrodes 107 can then be formed, for example, by a step of deposition of a conductive layer on the side of upper surface 101T of substrate 101, followed by steps of photolithography and etching enabling to individualize electrodes 107 for each transducer T.

FIG. 1C is a cross-section view illustrating a structure obtained at the end of a subsequent step of deposition, on the side of the upper surface 101T of transfer substrate 101, of a layer 109 of passivation of transducers T.

In the shown example, layer 109 coats the lateral walls of piezoelectric layers 105 as well as the lateral walls and the upper surface of the upper electrodes 107 of transducers T. In this example, layer 109 totally fills spaces laterally extending between piezoelectric transducers T. Layer 109 for example plays a role of passivation, or encapsulation, of transducers T. Layer 109 for example aims at protecting transducers T against outside aggressions due to humidity. Layer 109 further fulfills a function of planarization of the upper surface of the structure.

Layer 109 is for example deposited over the entire surface 101T, after which a step of planarization, for example, a chemical-mechanical polishing, is implemented to obtain a substantially planar upper surface. Layer 109 is for example in this case made of silicon dioxide ($SiO_2$). As a variant, layer 109 may be formed by depositing or by laminating a polymer, for example, benzocyclobutene (BCB), on the side of surface 101T.

Further, during this step, through openings 111 are formed in layer 109 vertically in line with the upper electrodes 107 of piezoelectric transducers T. In the shown example, a portion of the upper surface of each electrode 107 is exposed at the bottom of each trench 111. The openings 111 of layer 109 are for example formed by photolithography and then etching.

FIG. 1D is a cross-section view illustrating a structure obtained at the end of a subsequent step of forming of contacting elements 113 inside of openings 111.

In the shown example, contacting elements 113 integrally fill openings 111 and are flush with the upper surface of passivation layer 109. Contacting elements 113 are for example formed by full plate deposition of an electrically-conductive layer on the side of surface 101T, and then etching of the layer. As an example, contacting elements 113 are made of a metal, for example selected from the list of metals previously indicated for layer 103, or of a metal alloy. Contacting elements 113 are for example made of the same material as electrodes 107. As a variant, contacting elements 113 are formed by silk-screening of an electrically-conductive material of silver paste type. As an example, the contacting elements have a thickness in the order of 300 nm.

Further, during this step, an interconnection network 115 is formed on the side of the upper surface 101T of transfer substrate 101. The interconnection network is more precisely, in the example illustrated in FIG. 1D, located on top of and in contact with passivation and planarization layer 109. Although this has not been detailed in FIG. 1D, interconnection network 115 for example comprises metallization levels, for example, two metallization levels, separated from one another by dielectric layers. Each metallization level for example comprises a plurality of separate portions, electrically insulated from one another, of a same metal layer. Further, conductive vias, not shown in FIG. 1D, may be formed in interconnection network 115 to for example interconnect a plurality of portions of metal layers forming part of distinct metallization levels.

Each contacting element 113 for example enables to connect the upper electrode 107 of one of piezoelectric transducers T to one of the metallization levels (not shown in FIG. 1D) of interconnection network 115.

Further, during this step, metal pads 117 are formed on top of and in contact with the upper surface of interconnection network 115. In this example, pads 117 are located vertically in line with piezoelectric transducers T. Pads 117 are for example connected to another metallization level of interconnection network 115.

FIG. 1E is a cross-section view illustrating a structure obtained at the end of a subsequent step of transfer, onto substrate 101, of light-emitting diodes D.

In the shown example, light-emitting diodes D are more precisely transferred onto the side of the upper surface 101T of transfer substrate 101, vertically in line with piezoelectric transducers T. In this example, light-emitting diodes D and piezoelectric transducers T are stacked. Each light-emitting diode D for example comprises, like in the example illustrated in FIG. 1E, metal pads 119 placed in contact with metal pads 117 to connect light-emitting diodes D to interconnection network 115. As a variant, light-emitting diodes D may for example be connected to metal pads 117 while using structures of under bump metallization (UBM), microtube, etc. type.

The method described in relation with FIGS. 1A to 1E may be used to form display devices of large dimensions, for example screens for a television, computer, smartphone, digital tablet, etc., combining an image display function and an electromechanical transduction function, for example to form an interactive screen adapted to implementing functions of haptic feedback, sound emission, detection of the presence of a finger (based on a method comprising a transmit phase and then a reception phase), etc. Such a device may comprise a plurality of elementary monolithic electronic chips arranged, for example in an array layout, on a same transfer substrate. In the case of the device 100 illustrated in FIG. 1E, the elementary electronic chips may correspond to the rectangles symbolizing light emitting-diodes D. Elementary chips are rigidly assembled to transfer substrate 101 and connected to elements of electric connection of transfer substrate 101, comprising for example interconnection network 115, for their control. Each chip comprises one or a plurality of LEDs and a circuit for controlling said one or a plurality of LEDs. As an example, each chip comprises three LEDs, each individually-controllable by means of its respective control circuit, respectively defining three emission pixels adapted to respectively emitting red light, green light, and blue light. Each elementary chip for example corresponds to a display pixel of device 100.

As a variant, each chip comprises a single individual LED and comprises no integrated control circuit. An external control circuit, for example, formed in TFT ("Thin Film Transistor") technology, may then be formed on the transfer substrate.

FIG. 2 is a cross-section view illustrating a variant of the optoelectronic device 100 of FIG. 1E. FIG. 2 more precisely shows an optoelectronic device 200 comprising piezoelectric transducers T and light-emitting diodes D respectively connected on the side of two opposite surfaces of a same transfer substrate.

The device 200 of FIG. 2 comprises elements common with the device 100 of FIG. 1E. These common elements will not be detailed again hereafter. The device 200 of FIG. 2 differs from the device 100 of FIG. 1E mainly in that, in device 200, electromechanical transducers T are formed on the side of a second surface 101B of transfer substrate 101 (the lower surface of transfer substrate 101, in the orientation of FIG. 2) opposite to first surface 101T. In the shown example, the common electrode 103 of transducers T coats the lower surface 101B of substrate 101. Further, in this example, interconnection network 115 is located on top of and in contact with the upper surface 101T of substrate 101.

Device 200 is for example formed by a method similar to the method of manufacturing the device 100 previously described in relation with FIGS. 1A to 1E. As an example, the piezoelectric transducers are first formed on the side of surface 101B, then substrate 101 is bonded to a temporary support substrate, or handle, on the side of surface 101B. Interconnection network 115 is for example then formed on the side of surface 101T of transfer 101, after which the transfer of light-emitting diodes D onto the connection pads 117 topping interconnection network 115 is performed. One may then for example dissociate the temporary support substrate from the rest of the structure.

There has been shown in FIG. 2 an example where piezoelectric transducers T comprise no passivation layer. One may however provide the deposition of a passivation layer, for example, a layer similar to the layer 109 of device 100, on the side of the lower surface 101B of substrate 101 after the manufacturing or transfer of piezoelectric transducers T.

FIGS. 3A to 3I are cross-section views illustrating steps of a method of manufacturing and transfer of the light-emitting diodes D of device 100, 200 in the case where each light-emitting diode D corresponds to an elementary display pixel chip of device 100, 200.

Figure 3A:
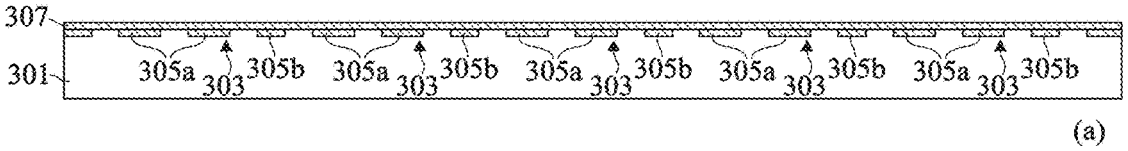
FIGS. 3A, 3B, 3C, 3D, 3E, 3F, 3G, 3H, and 3I are cross-section views illustrating successive steps of an example of a method of manufacturing an optoelectronic device according to an embodiment.
Figure 3A:
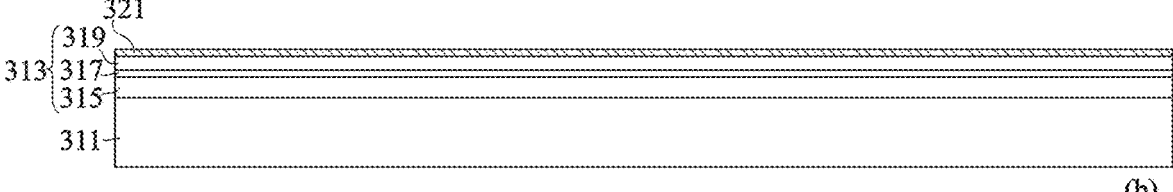

FIG. 3A comprises a view (a) schematically showing a control structure comprising a first substrate 301 inside and on top of which have been formed a plurality of elementary integrated control circuits 303, for example, identical or similar, respectively corresponding to the integrated control circuits of the future elementary pixel chips of device 100, 200.

Substrate 301 may have a monoblock structure or may correspond to a layer covering a support made of another material. Substrate 301 is for example made of a semiconductor material, for example, of silicon. As an example, substrate 301 is a single crystal silicon wafer or piece of wafer, the upper surface of substrate 301 having for example a <111> crystalline orientation. Substrate 301 may have a multilayer structure of silicon on insulator type, also called SOI, comprising a semiconductor support substrate, for example made of silicon, an insulating layer, for example, made of silicon oxide, arranged on top of and in contact with the upper surface of the support substrate, and an upper semiconductor layer, for example, made of single-crystal silicon, arranged on top of and in contact with the upper surface of the insulating layer.

In the case where substrate 301 is of SOI type, elementary control circuits 303 are for example formed inside and on top of the upper semiconductor layer of substrate 301. Each elementary control circuit 303 for example comprises a plurality of MOS transistors (not detailed in FIGS. 3A to 3I). Elementary control circuits 303 are for example formed in CMOS technology ("Complementary Metal Oxide Semiconductor"). Each elementary control circuit 303 may comprise a circuit adapted to controlling the emission of light by the LED(s) of the future elementary pixel chip of device 100, 200.

In this example, each elementary control circuit 303 comprises, on its upper surface side, one or a plurality of metal connection pads 305a, 305b. As an example, pads 305a, 305b are flush with the upper surface of an upper insulating layer, for example, made of silicon oxide, of an interconnection stack (not detailed in the drawings) coating the upper surface of the upper semiconductor layer of substrate 301. Thus, in this example, the upper surface of the control structure of view (a) is a planar surface comprising an alternation of metal regions (pads 305a, 305b) and of insulating regions.

As an example, each elementary control circuit 303 comprises a specific metal pad 305a for each LED of the future elementary pixel chip of the device, intended to be connected to an anode region of the LED and enabling to individually control the emission of light by said LED. Each elementary control circuit 303 may further comprise a metal pad 305b intended to be connected to a second terminal, for example, a cathode terminal of each LED of the future elementary pixel chip of the device. In the case where the elementary chip comprises a plurality of LEDs, the cathode contact may be common to all the LEDs of the chip. Thus, elementary control circuit 303 may comprise a single metal pad 305b.

As an example, each elementary pixel chip of the device comprises three individually-controllable LEDs adapted to respectively emitting blue light, green light, and red light. In this case, each elementary control circuit 303 may comprise three distinct metal pads 305a intended to be respectively connected to the anode regions of the three LEDs, and a single metal pad 305b intended to be collectively connected to the cathode regions of the three LEDs. In the cross-section view of FIG. 3A, only two metal pads 305a and one metal pad 305b per electronic circuit have been shown.

In the illustrated example, the upper surface of the control structure of view (a) is coated with a metal layer 307. In this example, layer 307 extends continuously and with a substantially uniform thickness over the entire upper surface of the interconnection stack of the control structure. Thus, layer 307 connects to one another all the metal pads 305a, 305b of the control structure.

FIG. 3A further comprises a view (b) very schematically showing a structure comprising a second substrate 311, having an active LED stack 313 resting thereon. Active LED stack 313 is for example an inorganic LED stack, for example, based on one or a plurality of semiconductor materials of III-V type, for example, based on gallium nitride. Substrate 311 is for example made of sapphire or of silicon.

Active LED stack 313 for example comprises, in the order from the upper surface of substrate 311, an N-type doped semiconductor layer 315 forming a cathode layer, an active layer 317, and a P-type doped semiconductor layer 319 forming an anode layer. Active layer 317 for example comprises an alternation of layers of quantum wells of a first semiconductor material and of barrier layers of a second semiconductor material defining a stack of multiple quantum wells. Although this has not been detailed in FIG. 3A, active LED stack 313 may further comprise one or a plurality of other layers, for example selected from among charge (electron or hole) injection, transport, or blocking layers.

Active stack 313 may be formed by epitaxy on the upper surface of substrate 311. As a variant, active stack 313 is formed by epitaxy on a growth substrate, not shown, and then transferred onto the upper surface of substrate 311.

At this stage, stack 313 has not been structured into individual LEDs yet. In other words, the layers of stack 313 each continuously extend with a substantially uniform thickness over the entire upper surface of substrate 311.

In the illustrated example, the upper surface of the structure of view (b) is coated with a metal layer 321 on top of and in contact with the upper surface of active LED stack 313. Metal layer 321 may be a single layer or a stack of a plurality of metal layers. Preferably, metal layer 321 comprises, on its upper surface side, a layer made of the same material as layer 307.

Figure 3B:
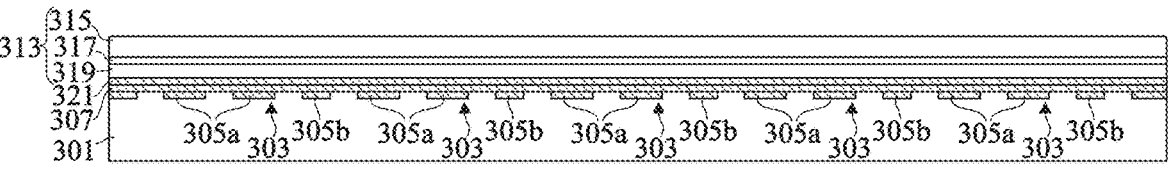

FIG. 3B illustrates the structure obtained at the end of a subsequent step of transfer and of bonding of active LED stack 313 and of metal layer 321 onto the structure of view (a) of FIG. 3A.

During this step, the structure of view (b) of FIG. 3A is transferred onto the upper surface of the structure of view (a) of FIG. 3A, by using substrate 311 as a handle. The upper surface (in the orientation of FIG. 3B, corresponding to the upper surface in the orientation of FIG. 3A) of metal layer 321 is bonded to the upper surface of metal layer 307. The bonding is for example obtained by direct bonding or molecular bonding of the lower surface of layer 321 to the upper surface of layer 307, that is, with no addition of material between the two layers.

Substrate 311 is then removed, for example by grinding and/or chemical etching, to free the access to the upper surface of active LED stack 313, that is, in this example, the upper surface of the semiconductor cathode layer 315 of active LED stack 313.

Figure 3C:
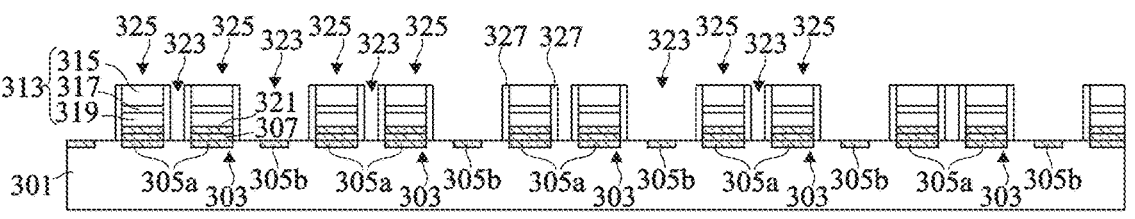

FIG. 3C illustrates a step of forming of trenches 323 vertically extending in active LED stack 313 from its upper surface and laterally delimiting, in stack 313, a plurality of islands 325 corresponding to the individual LEDs of the future elementary chips of the device. Trenches 323 are for example formed by plasma etching. In top view (not shown), trenches 323 form a grid laterally separating the elementary diodes 325 from one another.

FIG. 3C further illustrates a subsequent step of vertical extension of trenches 323 through metal layers 321 and 307, for example by using the same etch mask (not shown) as that used at the previous step. At the end of this step, trenches 323 emerge onto the upper surface of the interconnection stack coating the upper surface of substrate 301.

The portion of the stack of layers 321 and 307 remaining under each LED 325 at the end of this step forms an anode electrode of the LED. Said anode electrode is in contact, by its lower surface, with the upper surface of a connection metal pad 305a of the underlying elementary control circuit 303. Thus, each LED has its anode electrode individually connected to a metal connection pad 305a of an elementary control circuit 303.

In this example, a trench 323 is further formed in front of each metal connection pad 305b to free the access to the upper surface of pads 305b.

FIG. 3C further illustrates a subsequent step of passivation of the sides of LEDs 325. For this purpose, a layer 327 made of an electrically-insulating material, for example, silicon oxide or silicon nitride, is deposited by a conformal deposition method onto the upper surface of the structure. Layer 327 then coats the upper surface of and the sides of LEDs 325, as well as the sides of the portions of metal layers 307 and 321 located under LEDs 325, and, at the bottom of trenches 323, the upper surface of the interconnection stack coating substrate 301. A step of vertical anisotropic etching is then implemented to remove the horizontal portions of layer 327, and only keep the vertical portions of this layer, coating the sides of LEDs 325 and the sides of the portions of metal layers 307, and 321 located under LEDs 325.

Figure 3D:
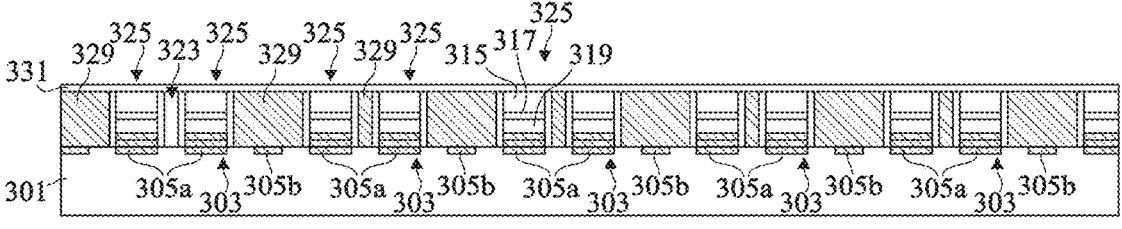

FIG. 3D illustrates a subsequent step of filling of trenches 323 with metal 329. As an example, metal 329 is initially deposited over the entire upper surface of the structure with a thickness greater than the depth of trenches 323, to entirely fill trenches 323. A step of planarization, for example by chemical-mechanical polishing, is then implemented to free the access to the upper surface of LEDs 325. A substantially planar upper surface having the semiconductor cathode regions 315 of LEDs 325, the vertical insulation regions 327 of the LEDs, and the metal regions 329 filling trenches 323 flush therewith is thus obtained. In top view (not shown), metal regions 329 form a conductive grid laterally separating LEDs 325 from one another. Metal regions 329 are electrically connected to metal pads 305b at the bottom of trenches 323, and define a cathode contact metallization common to all the LEDs 325 in the structure.

FIG. 3D further illustrates a subsequent step of deposition of a conductive layer 331, transparent to the emission wavelengths of the LEDs of the display device, onto the upper surface of the structure. Layer 331 for example continuously extends with a substantially uniform thickness over the entire upper surface of the structure. Layer 331 is for example made of a transparent conductive oxide, for example, of indium-tin oxide (ITO). As a variant, layer 331 may be a metal layer sufficiently thin to be transparent, for example, a silver layer having a thickness smaller than 80 nm.

Layer 331 is in contact, by its lower surface, with the upper surface of the cathode semiconductor regions 315 of LEDs 325 and defines a common cathode electrode of LEDs 325. Layer 331 is further in contact, by its lower surface, with the upper surface of metal region 329. Thus, layer 331 electrically connects the cathode semiconductor region 315 of each LED 325 to the common cathode contact metallization 329 of the structure.

Figure 3E:
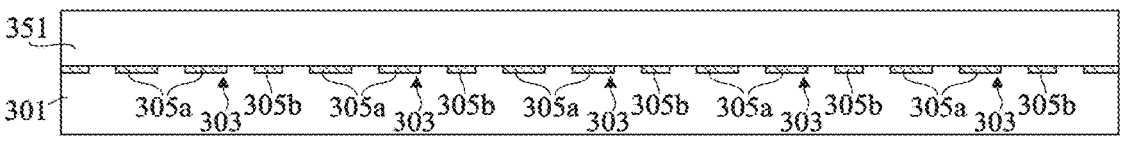

FIG. 3E is a cross-section view very schematically illustrating a structure of the type of that obtained at the end of the steps previously described in relation with FIG. 3D. In the shown example, the structure more precisely comprises substrate 301, inside and on top of which elementary integrated control circuits 303, topped with an emission stage 351, have been formed. Emission stage 351 comprises a plurality of LEDs (for example, LEDs 325 of FIG. 3D, not detailed in FIGS. 3E to 3I) individually controllable by circuits 303. To avoid overloading the drawing, only the pads 305a and 305b of integrated control circuits 303, located on the upper surface side of substrate 301, have been detailed in FIGS. 3E to 3I.

Figure 3F:
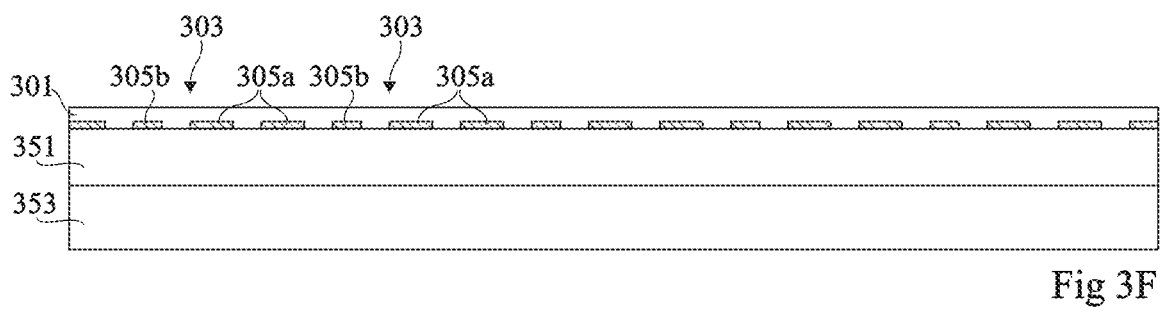

FIG. 3F illustrates a step of bonding of the structure of FIG. 3E onto a temporary support substrate 353, for example, made of silicon. The structure of FIG. 3E is bonded to support substrate 353 by its surface opposite to integrated control circuits 303, that is, by its lower surface in the orientation of FIG. 3F, corresponding to its upper surface in the orientation of FIG. 3E.

FIG. 3F further illustrates an optional step of thinning of semiconductor substrate 301, from its surface opposite to stage 351. In the case where integrated control circuits 303 are initially formed inside and on top of a SOI-type substrate, the thinning step of FIG. 3F may comprise removing the support substrate of the SOI substrate, to only keep the single-crystal silicon layer and the insulating layer of the SOI substrate.

As a variant, in a case where integrated circuits 303 are formed inside and on top of a solid silicon substrate, the thinning step may comprise decreasing the thickness of substrate 301, for example by grinding, from its upper surface (in the orientation of FIG. 3F). An insulating passivation layer (not detailed in the drawing) may then be deposited on the upper surface of thinned substrate 301.

Figure 3G:
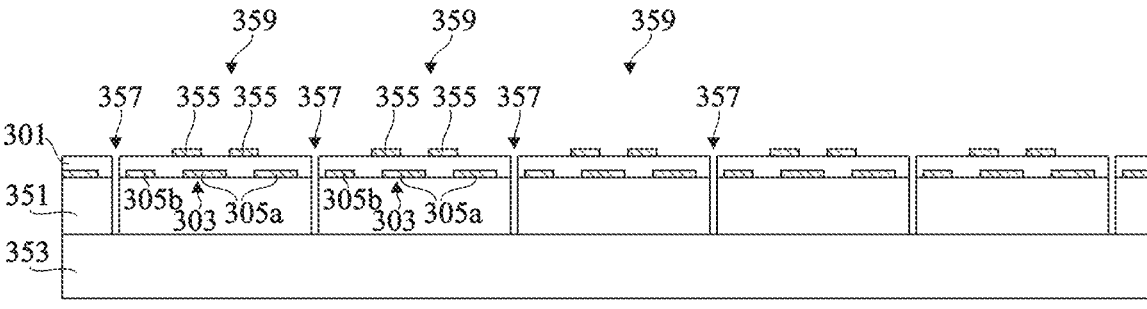

FIG. 3G illustrates a step of forming, on the upper surface side of substrate 301 (in the orientation of FIG. 3G), of metal connection pads 355 coupled to connection pads 305a and 305b and/or to connection terminals of electronic components, for example, MOS transistors, integrated circuits 303, via conductive vias not detailed in the drawing, crossing the semiconductor substrate 301 of integrated circuits 303. Pads 355 being for the most part coupled to terminals of connection to the inside of the circuit, their number is in practice greater than the number of pads 355.

FIG. 3G further illustrates a step of forming, from the upper surface of substrate 301, of trenches 357 vertically crossing integrated circuits 303 and emission stage 351 and emerging onto the upper surface of temporary support substrate 353. Trenches 357 laterally delimit a plurality of semiconductor chips 359 corresponding to the elementary pixel chips of the display device. Trenches 357 may be formed by plasma etching, by sawing, or by any other adapted cutting method.

Figure 3H:
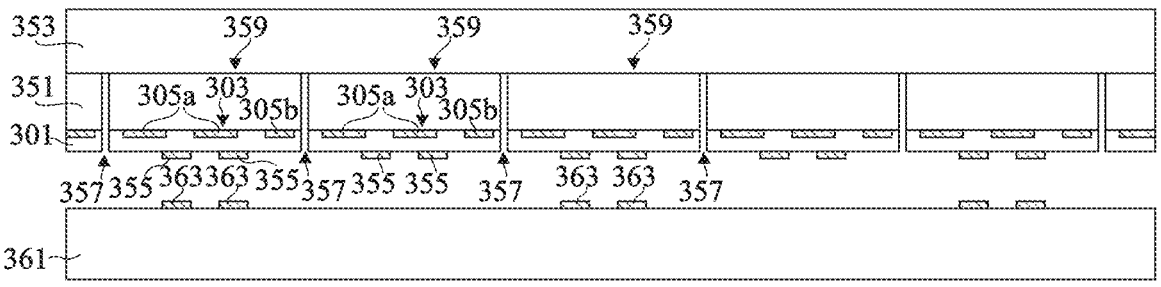
Figure 3I:
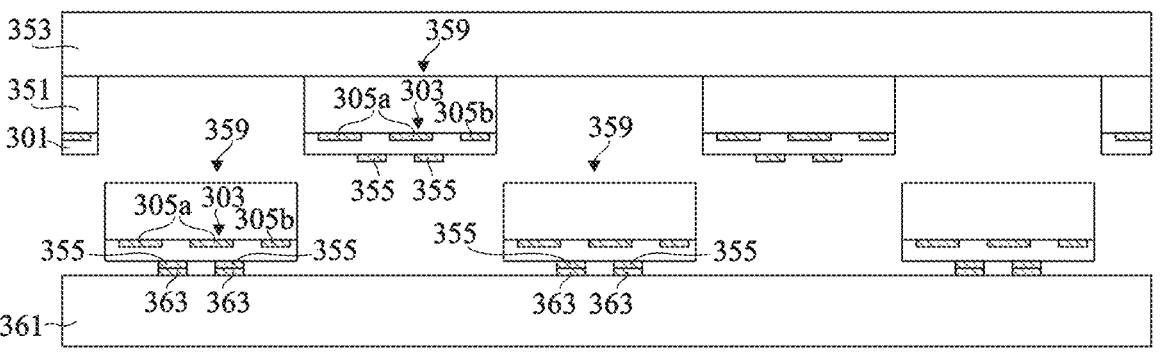

FIGS. 3H and 3I illustrate a step of bonding of elementary chips 359 onto the upper surface of a same transfer substrate 361 of the display device. Transfer substrate 361 comprises, on its upper surface side, a plurality of metal connection pads 363, intended to be bonded and electrically and mechanically connected to corresponding metal connection pads 355 of the elementary chips 359.

The structure of FIG. 3G is turned upside down (FIG. 3H) to place the metal connection pads 355 of elementary chips 359 in front of corresponding metal connection pads 363 of transfer substrate 361. Opposite pads 355 and 363 are then bonded and electrically connected, for example, by direct bonding, by welding, by means of microtubes, or by any other adapted method.

Once bonded to transfer substrate 361, elementary chips 359 are separated from temporary support substrate 353, and the latter is removed (FIG. 3I). As an example, the separation of chips 359 is performed by mechanical separation or by separation by means of a laser beam. A simultaneous collective transfer of a plurality of elementary chips 359 from temporary support substrate 353 to transfer substrate 361 is then performed.

The pitch (center-to-center distance in front view) of elementary chips 359 on transfer substrate 361 is for example a multiple of the pitch of elementary chips 359 on substrate 353. Thus, only part of elementary chips 359 (one out of two in the shown example) is simultaneously transferred from temporary support substrate 353 to transfer substrate 361. The other chips remain attached to temporary transfer substrate 353 and may be subsequently transferred onto another portion of transfer substrate 361 or onto another transfer substrate.

In a case where the method of FIGS. 3A to 3I is implemented to manufacture and then transfer elementary chips onto the side of surface 101T of the transfer substrate 101 of device 100 or 200, substrate 361 for example corresponds to transfer substrate 101 topped with interconnection network 115. Pads 361, located at the surface of substrate 361 then correspond to pads 117 supported by interconnection network 115, and the pads 355 of chips 359 correspond to the pads 119 of light-emitting diodes D.

There has been described hereabove an example of embodiment where each elementary chip comprises a stack of an integrated control circuit, for example, a CMOS circuit, and one or a plurality of inorganic LEDs. As a variant, each elementary chip may comprise a stack of an integrated control circuit, for example, a CMOS circuit, and one or a plurality of organic LEDs arranged on a surface of the control circuit.

Figures 4, 5:
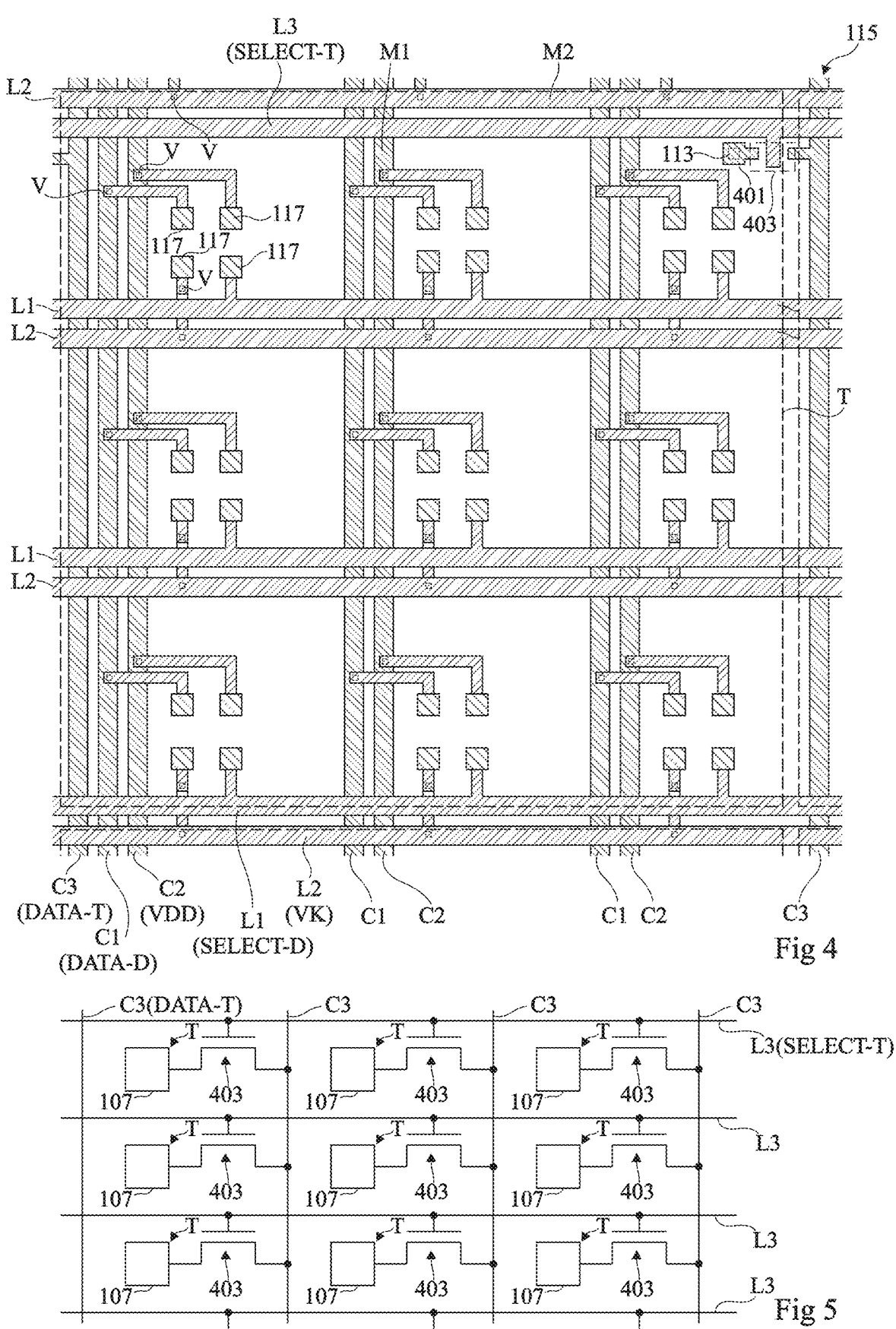
FIG. 4 is a partial simplified top view illustrating an example of embodiment of an interconnection network of an optoelectronic device.
FIG. 5 is an electric diagram equivalent to the interconnection network of FIG. 4.

FIG. 4 is a partial simplified top view illustrating an example of embodiment of the interconnection network 115 of the optoelectronic device 100 of FIG. 1E. FIG. 4 more precisely illustrates an example of embodiment of network 115 in the case where the light-emitting diodes D of device 100 correspond to elementary chips, each comprising a plurality of individually-controllable LEDs, for example, three individually-controllable LEDs adapted to respectively emitting blue light, green light, and red light.

For simplification, a portion only of interconnection network 115 located vertically in line with a piezoelectric transducer T topped with nine light-emitting diodes D of optoelectronic device 100 has been shown in FIG. 4.

Interconnection network 115 comprises electric connection elements, and in particular conductive tracks and conductive areas, formed by printing on the upper surface of planarization layer 109. The electric connection elements are for example formed by printing of a succession of conductive and insulating levels on the upper surface of layer 109. The electric connection elements are for example formed by a deposition or printing method of inkjet printing type, silk-screening, rotogravure, by vacuum deposition, or by any other adapted method.

In the shown example, interconnection network 115 comprises two stacked conductive metal levels M1 and M2 separated by an insulating level (not visible in FIG. 4), and metal vias V connecting the two metal levels M1 and M2 through the insulating level. In this example, interconnection network 115 further comprises metal connection areas (not visible in FIG. 4) formed on upper metal level M2, intended to be connected to connection pads 117.

In the shown example, the manufacturing of interconnection network 115 comprises the three following successive deposition steps.

During a first deposition step, a plurality of conductive tracks substantially parallel to the column direction of the display device (vertical direction in the orientation of FIG. 4) are formed on the upper surface of layer 109. More particularly, in this example, during the first deposition step, for each column of the display device, two conductive tracks C1 and C2 extending along substantially the entire length of the columns of the display device are formed. Tracks C1 are intended to convey a signal DATA_C for setting the light intensity emitted by the LEDs of the elementary chips in the column. Tracks C2 are intended to distribute a high power supply potential VDD to the different elementary pixel chips.

In this example, during the first deposition step, for each column of piezoelectric transducers T, a conductive track C3 extending along substantially the entire length of the columns of the display device is further formed. Track C3 is intended to convey a signal DATA_T for example enabling to control an intensity of a haptic feedback, in a case where piezoelectric transducers T are adapted to producing a haptic feedback, or image of a distance of a finger of a user with respect to device 100, in a case where piezoelectric transducers T are adapted to detecting the presence of a finger.

In the shown example, during the first deposition step, there is further formed, for each piezoelectric transducer T, a connection area 401 located on top of and in contact with the upper end of the contacting element 113 of the transducer. In this example, area 401 is further connected to a first conduction terminal (source or drain) of a transistor 403, the other conduction terminal of transistor 403 being connected to conductive track C3.

The conductive elements formed during this first deposition step define the first conductive level M1 of the transfer substrate.

During a second deposition step, the first conductor is covered with an insulating material (not shown in the drawing), to allow the subsequent deposition of conductive tracks extending above tracks C1, C2, and C3, without creating a short-circuit with tracks C1, C2, and C3.

During a third deposition step, there is formed on the upper surface of layer 109 a plurality of conductive tracks substantially parallel to the row direction of the display device. More particularly, in this example, during the third deposition step, there are printed, for each row of the display device, two conductive tracks L1 and L2 extending along substantially the entire length of the rows of the display device. Tracks L1 are intended to convey a signal SELECT_D of selection of the corresponding pixel row. Tracks L2 are intended to distribute a low power supply potential VK, for example smaller than potential VDD, to the different elementary pixel chips.

In the shown example, during the third deposition step, there is further formed, for each row of piezoelectric transducers, a conductive track L3 extending along substantially the entire length of the columns of the display device. Track L3 is intended to convey a signal SELECT_T of selection of the corresponding row of piezoelectric transducers T. In this example, track L3 is connected to each control electrode (gate) of the transistor 403 of each piezoelectric transducer T of device 100. Transistor 403 is for example a selection transistor adapted to selecting the associated piezoelectric transducer T according to the signal SELECT_T applied to its control electrode by track L3.

The conductive elements printed during this third deposition step define the second conductive level M2 of interconnection network 115.

After the third deposition step, there are for example formed, for each pixel, on conductive areas of metal level M2 (not shown), four conductive pads 117 intended to respectively receive four distinct connection pads 119 of the elementary chip of the pixel. Pads 117 for example allow a sequential addressing of the three LEDs of the chip.

FIG. 5 is an electric diagram equivalent to the interconnection network of FIG. 4. Conversely to FIG. 4 illustrating a portion of interconnection network 115 comprising a single piezoelectric transducer T, FIG. 5 illustrates a portion of interconnection network 115 comprising nine piezoelectric transducers T. In FIG. 5, each piezoelectric transducer T is symbolized by its upper electrode 107. Lower electrode 103 (not visible in FIG. 4) is for example common to all transducers T and taken to a reference potential, for example, the ground.

The interconnection network 115 of FIG. 5 for example forms part of an active array for controlling the light-emitting diodes D and the piezoelectric transducers T of device 100. As a variant, device 100 may comprise a passive array for controlling light-emitting diodes D and piezoelectric transducers T. In this case, tracks L3 and transistor 403 are for example omitted and tracks C3 are connected to the upper electrodes 107 of piezoelectric transducers T by contacting elements 113. In the case of a passive array, the lower electrode 103 of each piezoelectric transducer T is for example separate from the lower electrode 103 of the other piezoelectric transducers T of the device. The lower electrodes 103 of the transducers T of a same column are for example connected to a same vertical track similar to track C3 but for example formed in the metal layer having electrodes 103 formed therein.

It might alternately be provided to control the piezoelectric transducers T of device 100 by for example using transistors located in the control circuits 303 of the elementary chips 359 previously described in relation with FIGS. 3G to 3I.

An advantage of the embodiments described hereabove in relation with FIGS. 1A to 1E and with FIG. 2 lies in the fact that the piezoelectric transducers T and the light-emitting diodes D of devices 100, 200 respectively form first and second arrays capable of having different pitches. The pitch of the array of piezoelectric transducers T is preferably greater than the pitch of the array of light-emitting diodes D. This particularly enables to form transducers T having lateral dimensions greater than those of light-emitting diodes D. Transducers T may thus advantageously produce a haptic feedback more intense than that which would be obtained for example with coplanar arrays of piezoelectric transducers T and of light-emitting diodes D having substantially equal pitches.

Figure 6:
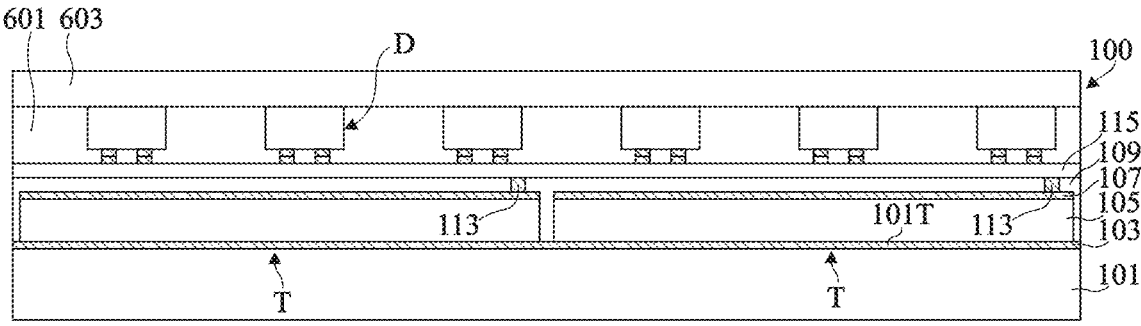
FIG. 6 is a cross-section view schematically and partially illustrating an alternative embodiment of the optoelectronic device of FIG. 1E.

FIG. 6 is a cross-section view schematically and partially illustrating an alternative embodiment of the optoelectronic device of FIG. 1E.

The device of FIG. 6 comprises the same elements as the device of FIG. 1E, arranged substantially in the same way.

In the example of FIG. 6, the device further comprises a planarization layer 601, for example, made of a polymer material, filling the space between elementary chips D. As an example, planarization layer 601 is flush with the upper surface of elementary chips D. As a variant (not shown), the planarization layer covers the upper surface of elementary chips D. In this case, planarization layer 601 is made of a material transparent to the light rays emitted by the LEDs of elementary chips D.

The device of FIG. 6 further comprises a transparent protection layer or cover 603, for example, made of glass, continuously extending over the entire surface of the device, above planarization layer 601 and elementary chips D.

Planarization layer 601 is made of a material capable of transmitting the acoustic vibrations emitted and received by transducers T.

Optionally, planarization layer 601 may ensure a function of bonding of protection cover 603.

Cover 603 protects the device and may form a surface of haptic action of the device.

Figure 7:
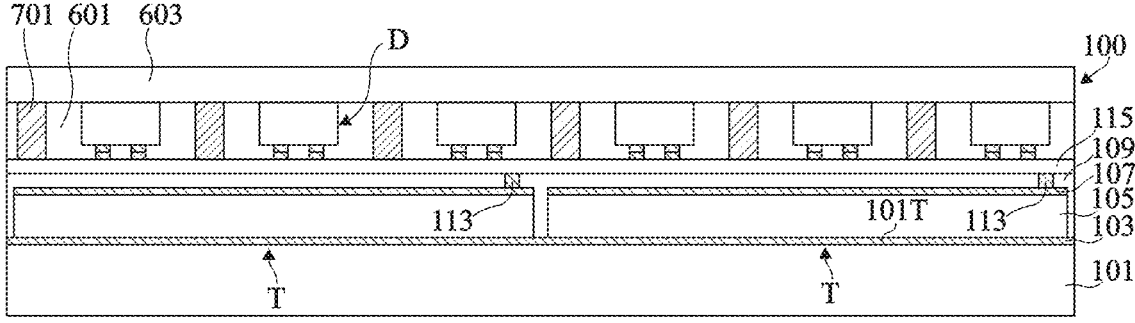
FIG. 7 is a cross-section view schematically and partially showing an alternative embodiment of the optoelectronic device of FIG. 6.

FIG. 7 is a cross-section view schematically and partially illustrating an alternative embodiment of the optoelectronic device of FIG. 6.

The device of FIG. 7 comprises the same elements as the device of FIG. 6, arranged substantially in the same way, and further comprises pillars 701 made of a material more rigid than the material of planarization layer 601, vertically crossing planarization layer 601 across its entire thickness.

In the shown example, pillars 701 extend from the lower surface of cover 603, down to the upper surface of interconnection network 115. As a variant, not shown, pillars 701 may vertically cross interconnection network 115 and emerge onto the upper surface of transducers T or of the passivation layer 109 of transducers T.

Pillars 701 enable to ensure a better transmission of the acoustic vibrations emitted and received by transducers T.

As an example, pillars 701 are formed in openings etched after the deposition of planarization layer 601 and before the deposition of cover 603.

Pillars 701 are for example made of metal or of any other material sufficiently rigid to transmit acoustic vibrations.

It should be noted that the variants of FIGS. 6 and 7 may be combined with the variant of FIG. 2.

Various embodiments and variants have been described. Those skilled in the art will understand that certain features of these various embodiments and variants may be combined, and other variants will occur to those skilled in the art. In particular, the forming, for the device 200 of FIG. 2, of an active or passive array for controlling piezoelectric transducers T and light-emitting diodes D similar to the active and passive arrays described in relation with FIGS. 4 and 5 is within the abilities of those skilled in the art based on the above indications.

Further, although embodiments where piezoelectric transducers T are rectangular or square and are arranged in an array, other shapes and arrangements are within the abilities of those skilled in the art. As an example, there may be provided piezoelectric transducers T, each having the shape of a horizontal or vertical strip, the transducers T of the device then being for example substantially parallel to one another.

Further, the described embodiments are not limited to the examples of materials and/or of dimensions mentioned in the present disclosure.

Finally, the practical implementation of the described embodiments and variants is within the abilities of those skilled in the art based on the functional indications given hereabove. In particular, the adaptation of the implementation of the method described in relation with FIGS. 1A to 1E to obtain a structure of the type of that described in relation with FIG. 2 is within the abilities of those skilled in the art based on the indications of the present disclosure.

Further, the practical forming of selection transistors 403 is within the abilities of those skilled in the art based on the above indications.

Further, the described embodiments are not limited to the numerical examples of electromechanical transducers detailed hereabove. As a variant, the transducers of the above-described examples may be replaced with any other type of electromechanical transducer, for example electroacoustic transducers, for example, ultrasound transducers, for example, membrane ultrasound transducers. As an example, the electromechanical transducers may be capacitive membrane transducers, for example, of CMUT type ("Capacitive Micromachined Ultrasonic Transducer"). As a variant, the electromechanical transducers may be piezoelectric transducers, for example, of PMUT type ("Piezoelectric Micromachined Ultrasonic Transducer").

The invention claimed is:

1. Optoelectronic device comprising at least one electromechanical transducer located vertically in line with at least one light-emitting diode, said at least one electromechanical transducer and said at least one light-emitting diode being connected to conductive tracks of a same transfer substrate, wherein each light-emitting diode comprises a monolithic elementary chip rigidly assembled to the transfer substrate and connected to elements of electric connection of the transfer substrate and comprises a plurality of elementary diodes respectively adapted to emitting light in different wavelength ranges and an elementary control circuit of the elementary diodes.

2. Device according to claim 1, wherein said at least one electromechanical transducer and said at least one light-emitting diode are located on the side of a same surface of the transfer substrate.

3. Device according to claim 1, wherein said at least one electromechanical transducer is located on the side of a first surface of the transfer substrate and said at least one light-emitting diode is located on the side of a second surface of the transfer substrate, opposite to the first surface.

4. Device according to claim 1, comprising a plurality of electromechanical transducers forming a first array and a plurality of light-emitting diodes forming a second array, the first array having a greater pitch than the second array.

5. Device according to claim 4, comprising a planarization layer extending laterally between the light-emitting diodes, and a transparent protection cover covering the light-emitting diodes and the planarization layer.

6. Device according to claim 5, further comprising pillars crossing the planarization layer and mechanically coupling the transducers to the transparent protection cover.

7. Device according to claim 1, wherein said at least one electromechanical transducer has greater lateral dimensions than said at least one light-emitting diode.

8. Device according to claim 1, wherein the conductive tracks form an interconnection array configured to control said at least one electromechanical transducer and said at least one light-emitting diode.

9. Device according to claim 1, further comprising, for each electromechanical transducer, a selection transistor connected to said electromechanical transducer.

10. Device according to claim 9, wherein the selection transistor comprises a first conduction terminal connected to an electrode of said electromechanical transducer, a second conduction terminal connected to one of the conductive tracks of the transfer substrate and a control terminal connected to another track among the conductive tracks of the transfer substrate.

11. Device according to claim 1, wherein said at least one electromechanical transducer comprises an active layer based on lead zirconate titanate or on aluminum nitride.

12. Device according to claim 1, wherein each light-emitting diode comprises a single elementary diode adapted to emitting light in a wavelength range.

13. Device according to claim 1, wherein said at least one electromechanical transducer is a piezoelectric transducer.

14. Device according to claim 1, wherein said at least one electromechanical transducer is a PMUT or CMUT transducer.

15. Optoelectronic device comprising at least one electromechanical transducer located vertically in line with at least one light-emitting diode, said at least one electromechanical transducer and said at least one light-emitting diode being connected to conductive tracks of a same transfer substrate, wherein each light-emitting diode comprises an elementary chip comprising a plurality of elementary diodes respectively adapted to emitting light in different wavelength ranges and an elementary control circuit of the elementary diodes, and a plurality of electromechanical transducers forming a first array and a plurality of light-emitting diodes forming a second array, the first array having a greater pitch than the second array.

16. Optoelectronic device comprising at least one electromechanical transducer located vertically in line with at least one light-emitting diode, said at least one electromechanical transducer and said at least one light-emitting diode being connected to conductive tracks of a same transfer substrate, wherein each light-emitting diode comprises an elementary chip comprising a plurality of elementary diodes respectively adapted to emitting light in different wavelength ranges and an elementary control circuit of the elementary diodes, and wherein said at least one electromechanical transducer has greater lateral dimensions than said at least one light-emitting diode.

* * * * *